(12) United States Patent
Staron et al.

(10) Patent No.: US 6,365,832 B1
(45) Date of Patent: Apr. 2, 2002

(54) ENCLOSURE FOR ELECTRICAL PACKAGE AND END PIECE THEREFOR

(75) Inventors: James S. Staron, Halifax; John M. Spickler, Columbia; Elizabeth A. Deppen, York, all of PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/578,102

(22) Filed: May 24, 2000

(51) Int. Cl.[7] .................................................. H05K 5/00
(52) U.S. Cl. ....................... 174/52.1; 361/737; 361/740; 361/747; 361/759; 439/946
(58) Field of Search ............................... 174/52.1, 52.4; 439/76.1, 946; 206/706, 707, 708, 709, 307, 308.1; 361/736, 737, 740, 741, 742, 748, 752, 758, 759

(56) References Cited

U.S. PATENT DOCUMENTS

| | | | |
|---|---|---|---|
| 5,470,237 A | * 11/1995 | Byczek et al. | 439/76.1 |
| 5,548,483 A | * 8/1996 | Feldman | 361/737 |
| 5,754,404 A | * 5/1998 | Biermann et al. | 361/737 |
| 5,760,998 A | * 6/1998 | Berberich et al | 360/97.02 |
| 5,920,460 A | * 7/1999 | Oldendorf et al. | 361/753 |
| 5,940,275 A | 8/1999 | Laity | 361/737 |

* cited by examiner

Primary Examiner—Anthony Dinkins
Assistant Examiner—Carmelo Oliva
(74) Attorney, Agent, or Firm—Woodcock Washburn LLP

(57) ABSTRACT

An enclosure for an electrical package and an end piece therefore are disclosed. The enclosure includes a pair of half shells combined to define an interior cavity within which the electrical package resides. The interior cavity as defined by the half shells is open at one end thereof. The end piece is mounted to the half shells as combined to cover the open end of the interior cavity and close the electrical package within the enclosure at such open end.

32 Claims, 4 Drawing Sheets

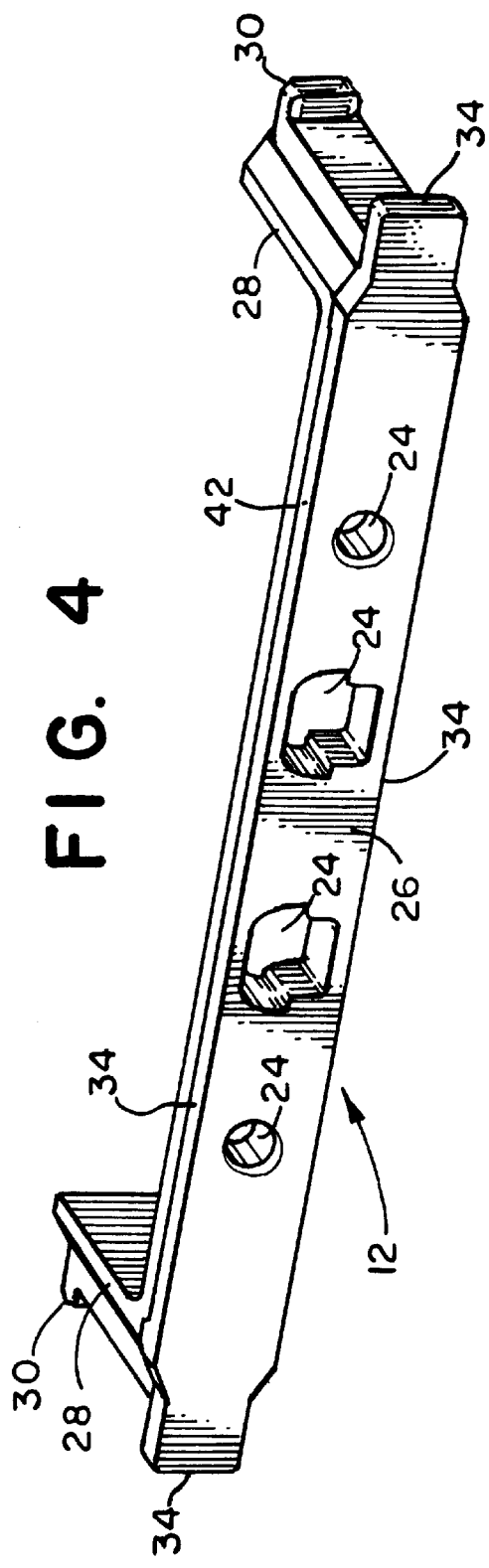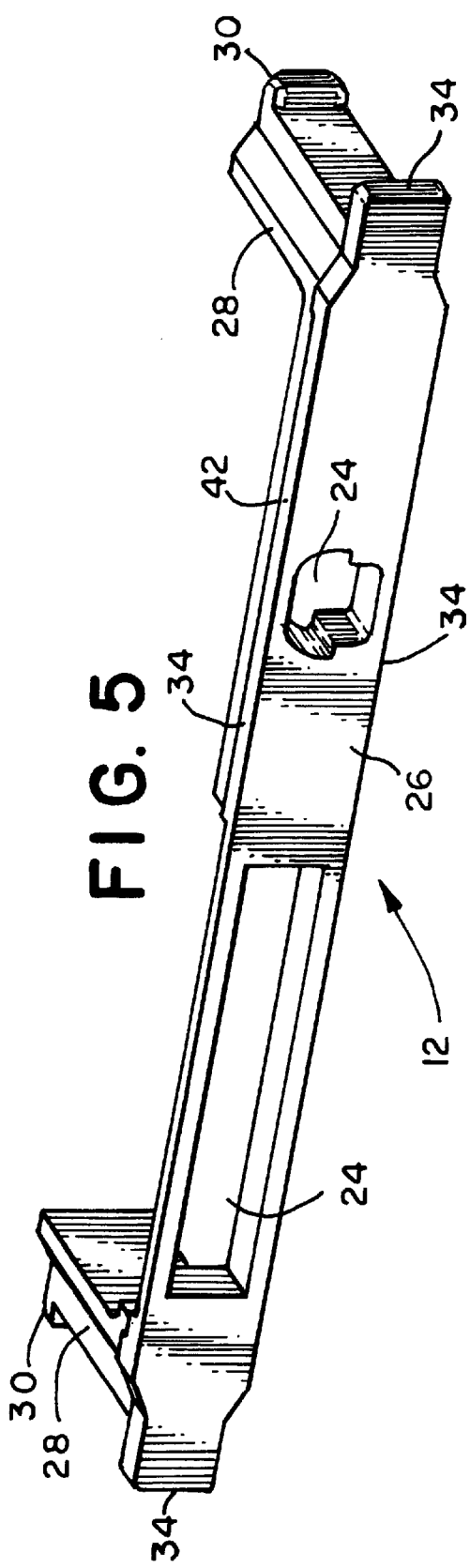

ENCLOSURE FOR ELECTRICAL PACKAGE AND END PIECE THEREFOR

FIELD OF THE INVENTION

The present invention relates to an enclosure for substantially enclosing an electrical package, and an end piece coupled to one end of such enclosure. More particularly, the present invention relates to such an enclosure for enclosing and defining an electronic or IC card such as a PC card, and an end piece for the end opposite the connector end of such card.

BACKGROUND OF THE INVENTION

It has become increasingly popular to provide an electronic device with a slot for receiving a package or 'card' that provides additional functionality to the device. For example, in connection with portable personal computers ('laptops', e.g.) and other portable electronic devices, it has become commonplace to add additional functionality or the like merely by inserting a PC card such as that defined by the Personal Computer Memory Card International Association (PCMCIA) with appropriate hardware/software into a PC card slot on such computer/device. Accordingly, the computer/device can be provided with extra memory, extra processing capabilities, extra applications, and/or other features. Likewise, the computer/device can be provided with add-on hardware such as an Ethernet connection, a land-line modem, a wireless modem, a hard or floppy disk drive. To summarize, a PC card can be employed to provide a multitude of hardware and software capabilities to the computer/device.

Importantly, all PC cards are built according to standards set forth by PCMCIA. Such standards provide (among other things) physical specifications for three types of PC Cards, with additional provisions for extended cards. All three card types measure the same length and width and use a standard 68-pin connector at one longitudinal end thereof. The only difference between the card types is thickness. In particular, Type I, Type II, and Type III cards are 3.3, 5.0, and 10.5 millimeters thick, respectively. Because they differ only in thickness, a thinner card can be used in a thicker slot, but a thicker card cannot be used in a thinner slot. The card types each have features that fit the needs of different applications. Type I PC Cards are typically used for memory devices such as RAM, Flash, OTP, and SRAM cards. Type II PC Cards are typically used for I/O devices such as data/fax modems, LANs, and mass storage devices. Type III PC Cards are used for devices whose components are thicker, such as rotating mass storage devices. Extended cards allow the addition of components that must remain outside the system for proper operation, such as antennas for wireless applications.

Typically, a PC card or the like includes an enclosure that defines the aforementioned length, width, and thickness of such card. Such enclosure also defines an interior within which the functional elements of such card reside. Such enclosure may be of a metallic nature to act as an electromagnetic shield. As was noted above, a standard 68-pin connector is provided at one longitudinal end of the enclosure to mate with a corresponding connector within the PC card slot defined in the computer I device. The opposing longitudinal end of the enclosure may be tapered in the thickness direction for ease in grasping during insertion into and retrieval from a slot, among other things.

However, tapering such opposing longitudinal end results in the disadvantage that the full thickness of the PC card is not available at such opposing end for accommodating higher profile elements at such opposing end. For example, such higher profile elements may include one or more connectors such as an RF connector, a multi-pin connector, or the like for accepting an appropriately configured inserted mating connector. Accordingly, it is at least some times preferable to not taper the opposing end in the thickness direction.

Typically, the enclosure is formed by combining upper and lower half shells, thereby defining the interior within which the aforementioned functional elements and reside. Also typically, such functional elements are sandwiched between the upper and lower half shells during the formation of such enclosure. Further typically, the lateral edges of the half shells contact and are secured to one another to form the enclosure and retain the functional elements between the half shells. In the case where the opposing end is tapered, the corresponding longitudinal edges of the half shells may also contact and be secured to one another.

However, in the case where the opposing end is not tapered, and especially where access must be had through the opposing end to a connector or the like within the enclosure, the corresponding longitudinal edges of the half shells should not be contacted and secured to one another. Instead, the enclosure should be provided with an end piece or cap to cover such opposing end, and such end piece or cap should be provided with appropriate apertures for the aforementioned access, if necessary.

It is known to form such end piece or cap by providing each of the half shells with an appropriately configured half end piece, where the half end pieces combine during combining of the half shells to form a whole end piece. Such half end pieces may be constructed from a material amenable to a heat or sonic welding process, and thus are secured to one another by way of such heat or sonic welding process. However, such heat or sonic welding process has been found to be undesirable in that such process could and does damage functional elements already sandwiched within the enclosure by the half shells. Moreover, such half end pieces can be different from one another, based on the apertures provided, and thus can interfere with a desire to form the enclosure with identical half shells.

Accordingly, a need exists for an end piece for such enclosure that is formed as a substantial unitary body separate from the half shells, whereby heat or sonic welding need not be employed to form the enclosure, and whereby the half shells forming the enclosure can be substantially identical.

SUMMARY OF THE INVENTION

The present invention satisfies the aforementioned need by providing an enclosure for an electrical package and an end piece therefor. The enclosure comprises a pair of half shells combined to define an interior cavity within which the electrical package resides. The interior cavity as defined by the half shells is open at one end thereof. The end piece is mounted to the half shells as combined to cover the open end of the interior cavity and close the electrical package within the enclosure at such open end.

BRIEF DESCRIPTION OF THE DRAWINGS

The foregoing summary as well as the following detailed description of the present invention will be better understood when read in conjunction with the appended drawings. For the purpose of the illustrating the invention, there are shown in the drawings embodiments which are presently preferred. As should be understood, however, the invention is not limited to the precise arrangements and instrumentalities shown. In the drawings:

FIGS. 4–6 are perspective views of alternate end pieces for use in connection with the enclosure of FIGS. 1 and 2 in accordance with one embodiment of the present invention.

DETAILED DESCRIPTION OF PREFERRED EMBODIMENTS

Figure 1:
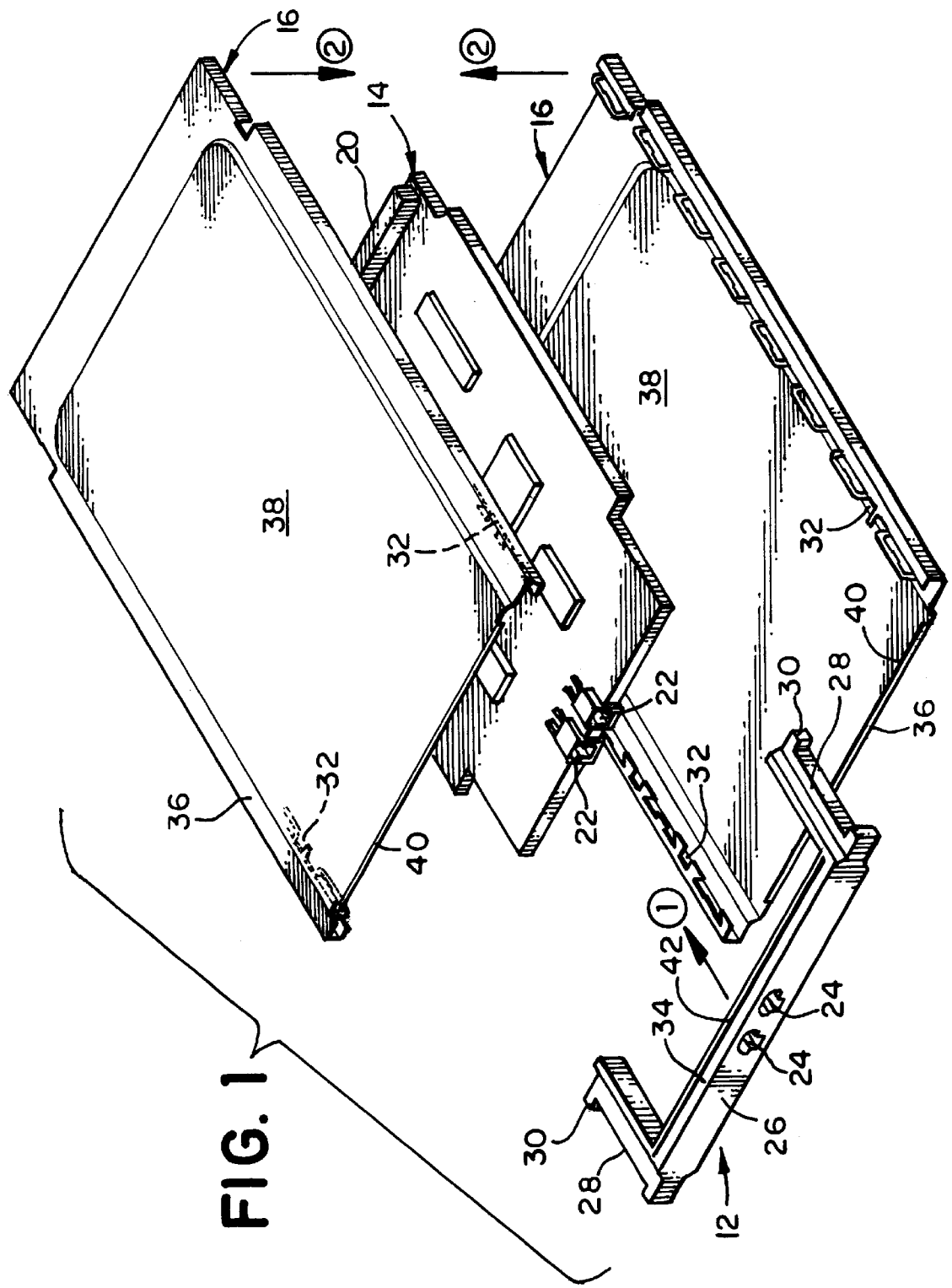
FIG. 1 is an exploded perspective view of an enclosure for an electrical package and an end piece for the enclosure in accordance with one embodiment of the present invention.

Certain terminology may be used in the following description for convenience only and is not considered to be limiting. For example, the words "left", "right", "upper", and "lower" designate directions in the drawings to which reference is made. Likewise, the words "inwardly" and "outwardly" are directions toward and away from, respectively, the geometric center of the referenced object. The terminology includes the words above specifically mentioned, derivatives thereof, and words of similar import.

Figure 2:
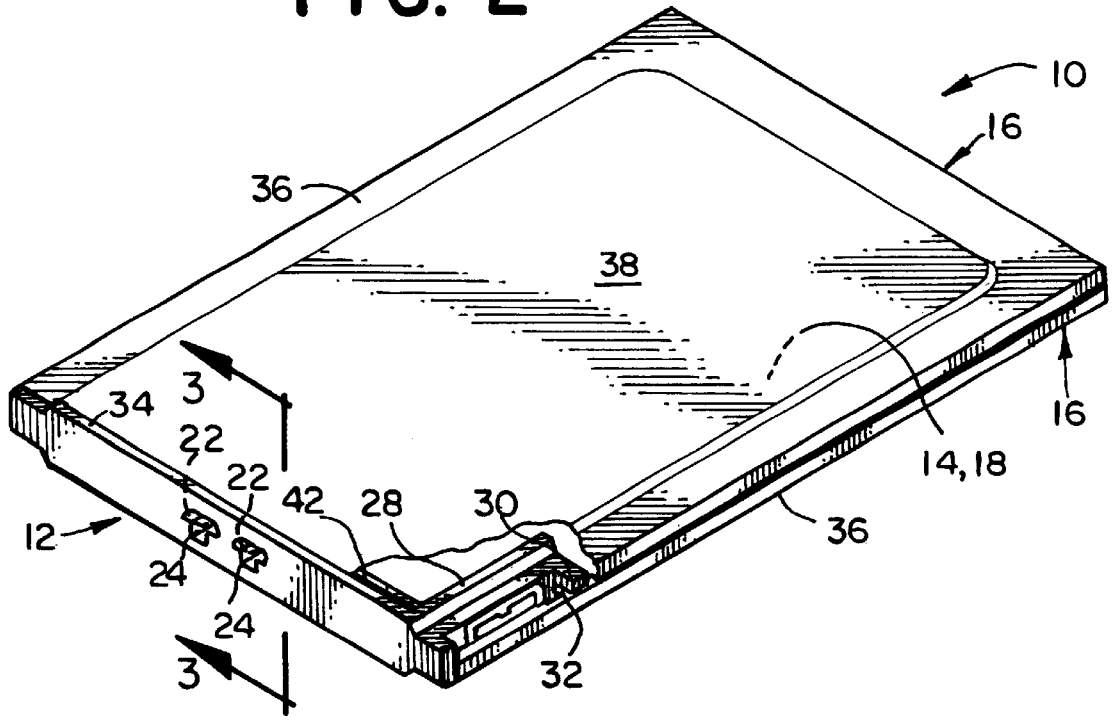
FIG. 2 is a non-exploded perspective view of the enclosure and end piece of FIG. 1 in accordance with one embodiment of the present invention.

Referring to the drawings in detail, wherein like numerals are used to indicate like elements throughout, there is shown in FIGS. 1 and 2 an enclosure 10 and an end piece 12 therefor in accordance with one embodiment of the present invention. As seen, the enclosure 10 is for enclosing an electrical package 14 therein, and includes upper and lower half shells 16 that combine to define an interior cavity 18 (FIG. 3) within which the electrical package 14 resides. As may be appreciated, the interior cavity 18 as defined by the upper and lower half shells 16 is open at one end thereof. However, the end piece 12 closes the enclosure 10 at such open end, thereby enclosing the electrical package 14 within the enclosure 10 at such open end. In particular, the end piece 12 is mounted to the upper and lower half shells 16 as combined to cover such open end.

In one embodiment of the present invention, the enclosure 10 defines a PC card or the like. Accordingly, the half shells 16 are appropriately dimensioned to conform to PCMCIA dimensional specifications (Type, I, II, or III, as appropriate) when combined. Nevertheless, such enclosure 10 may define any other type of device or assembly without departing from the spirit and scope of the present invention. Preferably, the half shells 16 are formed from a conductive material such as a stainless steel so that the enclosure acts as an electromagnetic shield, although such half shells 16 may be formed from other materials, conductive or otherwise, again without departing from the spirit and scope of the present invention.

The half shells 16 may be formed in any appropriate manner. For example, such half shells 16 may be molded in their final form in an appropriate mold. More likely, though, such half shells are stamped and/or appropriately bent from a sheet of material in one or more forming operations. Forming such half shells is known to the relevant public, and accordingly a further description of the details of such forming is not set forth herein.

In one embodiment of the present invention, the half shells 16 are 'ROCARD' PC card half shells as designed and marketed by FCI Electronics of Etters, Pennsylvania. As should be understood, such half shells are formed to include laterally arranged supports or frames, whereby a separate frame within the interior 18 of the PC card enclosure 10 formed by such half shells 16 is not necessary. Such a lateral support could be a plastic member (not shown) extending along the latching structure on at least one side of shell 16. Accordingly, the extra space that would have been taken up within such interior 18 is available for the electrical package 14. The half shells 16 and enclosure 10 are more fully described in U.S. patent applications Nos. 08/628,480; 08/651,352; 08/748,503; 08/999,312; and 09/297,776, hereby incorporated by reference.

Generally, the half shells 16 are formed to be substantially identical such that any two such half shells 16 may be combined to form an enclosure 10. In addition, the half shells 16 include interlocking features at lateral sides thereof that securely non-releasably interlock when such half shells 16 are combined to define the interior cavity 18. As seen, one lateral side of each half shell 16 includes a flange at the distal portion of which are a plurality of latches, and the other lateral side of each half shell 16 includes another flange at the distal portion of which are a plurality of catches.

Thus, the half shells 16 are combined to define the interior cavity 18 by aligning the latches of each half shell 16 with the catches of the other half shell 16, and then compressing along the lateral sides to pressure the latches into the catches. As may be appreciated, non-releasability is achieved by providing each latch with a back-latch that prevents removal of such latch from the corresponding catch. Thus, sonic or heat welding is not necessary. Although the present invention is disclosed in terms of generally identical half shells 16, it is to be appreciated that other half shells 16 which are non-identical or which are secured to each other in a different manner or different structure may also be employed without departing from the spirit and scope of the present invention As may be appreciated, the electrical package 14 secured and sandwiched between the half shells 16 may be any appropriate package without departing from the spirit and scope of the present invention. For example, and as was discussed above, the electrical package 14 could be a memory device such as RAM, ROM, SRAM, flash memory, and the like mounted on a circuit substrate; or an I/O device such as a data/fax modem, a LAN or Ethernet link, a mass storage devices, and the like. As seen, in accordance with the PCMCIA standard, each electrical package 14 is provided with a standard 68-pin connector 20 at one longitudinal end thereof, although such connector 20 may be omitted or modified without departing from the spirit and scope of the present invention, for example if the electrical package 14 is not a package conforming to the PCMCIA standard.

At the opposing longitudinal end of the electrical package 14, one or more connectors 22 may be positioned to be accessed through the corresponding opposing longitudinal end of the enclosure 10, although such connectors 22 may be omitted without departing from the spirit and scope of the present invention. Any appropriate connectors 22 and number of connectors 22 may be employed without departing from the spirit and scope of the present invention. For example, such connectors 22 may be one or more telephone connectors or one or more multi-pin connectors if the package 14 includes a land line modem, and/or one or more RF connectors if the package 14 is a wireless modem, for example.

In the case where such connectors 22 are employed, and/or in the case where higher profile devices are located in the electrical package 14 at the opposing end thereof, the opposing end of the enclosure 10 is not tapered in the thickness direction. Accordingly, such opposing end of the enclosure 10 may accommodate such connectors 22 and/or higher profile devices. As a practical matter, in the case where the enclosure 10/package 14 defines a PC card, such connectors 22 and/or higher profile devices may require the enclosure 10 to have a minimum thickness such that the PC card is a Type II or Type III card. However, such card may also be a Type I card without departing from the spirit and scope of the present invention.

Figure 6:
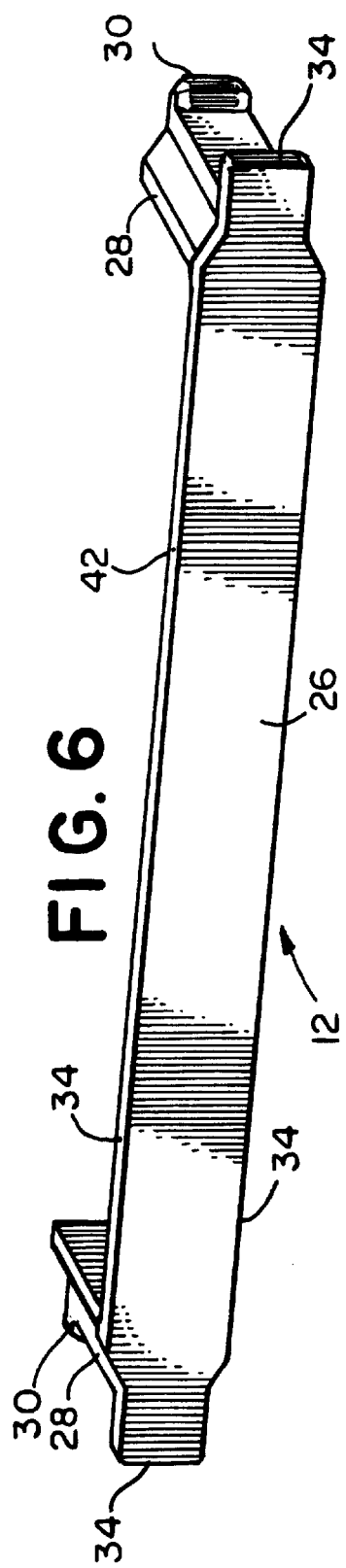

As seen in FIGS. 1 and 2, the end piece 12 closes the enclosure 10 at the opposing longitudinal end (i.e., open end) thereof, and therefore must be provided with apertures 24 corresponding to the connectors 22, if in fact such connectors 22 are present at the opposing end of the package 14, so that external access to such connectors 22 may be obtained. Of course, depending on the connectors 22 on the electrical package 14, the size and position of the apertures 24 may vary, as for example seen in FIGS. 4 and 5. Moreover, and as seen in FIG. 6, such apertures 24 may be omitted without departing from the spirit and scope of the present invention, especially in the case where the connectors 22 are not present in the package 14, but a non-tapered end is desired to accommodate components on package 14. Notably, and with regard to a PC card, regardless of the type of package 14 in the enclosure 10 and the arrangement of apertures 24 in the end piece 12 closing the enclosure 10 at the opposing end thereof, such enclosure does not change except as between PCMCIA Types I, II, or III. Thus, the enclosure 10 is highly modular.

In one embodiment of the present invention, the end piece 12 is formed as a substantially unitary body. The end piece 12 may be formed from a material such as a polycarbonate, although any other material may be employed without departing from the spirit and scope of the present invention. Such end piece 12 may be formed by any appropriate operation or series of operations, again without departing from the spirit and scope of the present invention. For example, the end piece 12 may be molded into its final form, or may be stamped from a sheet of material and then perhaps appropriately bent. It may be advantageous to form the end piece 12 from a conductive material or with a metallized surface such as a metallized plastic in order that the end piece 12 can act as a shield at the open end of the enclosure. Conversely, it may be advantageous to form the end piece from a non-conductive material in order that the end piece 12 not short any devices in the electrical package 14 or any connector connecting thereto.

As best seen in FIG. 1, the end piece 12 includes a cover section 26 generally positioned at the open end of the enclosure 10 to close such open end, and a pair of arms 28 that extend from the cover section 26 and into the interior cavity 18 of the enclosure as defined by the half shells 16. Each such arm 28 preferably extends generally along a respective lateral side of the enclosure 10 as formed by the half shells 16, and more preferably is shaped to conform to each of the upper and lower half shells 16 as defining the interior cavity 18. Thus the arms 28 may both at least partially assist in providing structural integrity to the enclosure 10. That is, such arms 28 can assist in resisting certain forces that may be exerted on the enclosure 10 either during insertion into or withdrawal from a corresponding slot (not shown), or at other times. In addition, such arms 28 are positioned out of the way of the electrical package 14. As a result, space within the enclosure 10 that may be employed by the electrical package 14 is maximized.

In one embodiment of the present invention, the upper and lower half shells 16 in combination define a notch at each lateral side of the enclosure 10, and each arm 28 includes a finger 30 that extends into a respective notch to secure the end piece 12 to the upper and lower half shells 16 as combined to form the enclosure 10. For example, and as shown, each half shell 16 may define a half-notch 32 at each lateral side thereof (FIG. 1) such that the half-notches 32 in combination (broken-away portion of FIG. 2) form the notches at each lateral side of the enclosure 10. Of course, such notches may be wholly formed in one or the other of the half shells 16 without departing from the spirit and scope of the present invention. As seen, each notch as formed by the half-notches 32 or otherwise is adjacent and opens into the interior cavity 18, and each finger 30 extends away from the other finger 30 and into the respective notch. As should be appreciated from FIG. 1 in particular, each half-notch 32 may be defined within structure in the lateral side of the half shell 16, or may be defined by a generally inward extension from the lateral side. In the latter case, the extension need only be positioned to reside on the side of the finger 30 closer to the cover section 26.

As can be appreciated from FIGS. 1 and 2, in one embodiment of the present invention, the cover section 26 of the end piece 12 has a perimeter 34 that traces about the edge of such cover section 26, the upper and lower half shells 16 as combined define an exterior surface 36 of the enclosure 10, and the perimeter 34 of the cover section 26 is generally co-extensive with the exterior surface 36 of the enclosure 10. That is, the transition between the enclosure 10 at such exterior surface 36 and the end piece 12 at such perimeter 34 of the cover section 26 thereof is generally smooth and continuous. Accordingly, the cover section 26 of such end piece 12 does not interfere with the insertion of the enclosure 10/package 14/end piece 12 combination into a corresponding receiving slot.

Figure 3:
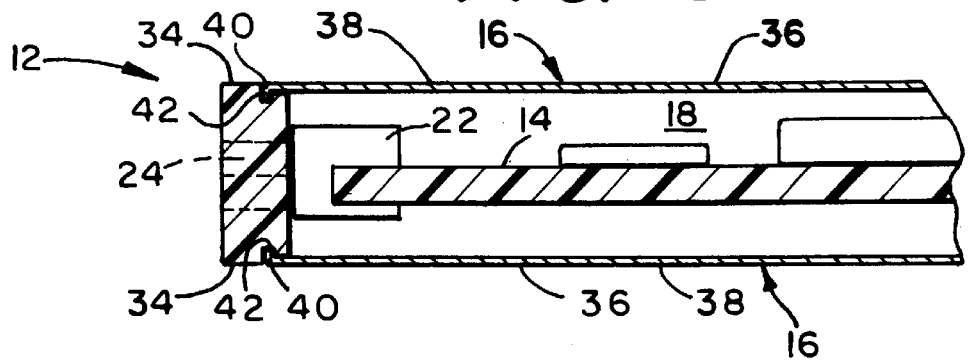
FIG. 3 is a cross-sectional view of a portion of the end piece and enclosure FIG. 2.

As can best be appreciated from FIGS. 1 and 3, in one embodiment of the present invention, each half shell 16 has a generally planar exterior panel 38, where such panel 38 generally has the width and length of the enclosure 10. More particularly, each panel 38 has an edge at the open end/ opposing end of the enclosure 10, and a flange 40 extends from the edge and into the open end. Thus, the flange 40 of each half shell 16 extends generally toward the flange 40 of the other half shell 16. As best seen in FIG. 3, the perimeter of the cover section 26 of the end piece 12 includes opposing sides generally corresponding to the exterior panels 38 of the half shells 16, and each opposing side includes a groove 42 that extends generally along the opposing longitudinal end of the enclosure 10. As should now be apparent from FIG. 3, each groove 42 accepts a flange 40 from a respective one of the half shells 16. Thus, the grooves 42 and the flanges 40 at least partially secure the end piece 12 to the half shells 16 as combined to form the enclosure 10. Of course, variations on the grooves 42 and flanges 40 may be employed without departing from the spirit and scope of the present invention. For example, the grooves 42 and flanges 40 can be discontinuous, or can occupy less than substantially all of the opposing longitudinal end of the enclosure. Moreover, if the end piece 12 is well secured to if the enclosure 10 by the fingers 30 as received in the notches, such grooves 42 and flanges may be dispensed with.

To construct the enclosure 10 with the electrical package 14 and the end piece 12, the half shells 16 are combined to define the enclosure 10 and the interior cavity 18 thereof within which the electrical package 14 resides, and the end piece 12 is mounted to the half shells 16 to cover the open end of the interior cavity 18 and close the electrical package 14 within the enclosure 10 at such open end. In one embodiment of the present invention, and in particular, such mounting and combining is accomplished by firstly positioning the end piece 12 between the half shells 16, as shown by the arrow 1 in FIG. 1, and then secondly securing the half shells 16 together to thereby retain the positioned end piece 12 therebetween, as shown by the arrows 2 in FIG. 1. As seen in FIG. 1, and as should be evident, the electrical package 14 is also positioned between the half shells 16 and is thus sandwiched within the interior cavity 18 of the enclosure 10 formed by the combined half shells 16.

Figure 7:
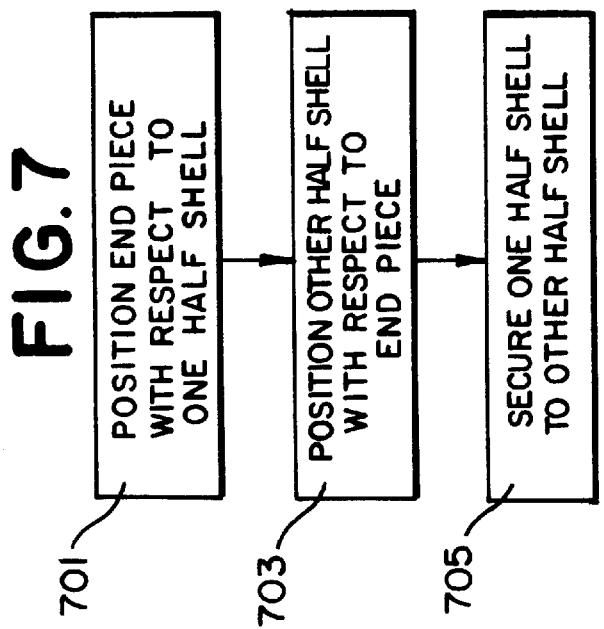
FIG. 7 is a flow chart detailing steps performed in forming the enclosure with the end piece of FIGS. 1 and 2 accordance with one embodiment of the present invention.

Of course, the various individual elements must be properly arranged and aligned during the aforementioned positioning and combining. In one embodiment of the present invention, and referring now to FIG. 7, the end piece 12 is appropriately positioned with respect to the lower half shell 16 such that the fingers 30 of the end piece 12 are properly aligned with the half-notches 32 of such lower half shell 16 (step 701), and the upper half shell 16 is appropriately positioned with respect to the lower half shell 16 and the positioned end piece 12 such that the fingers 30 of the end piece 12 are properly aligned with the half-notches 32 of such upper half shell 16 (step 703). Of course, at the same time, the electrical package 14 is also appropriately positioned with respect to the upper and lower half shells 16. Thereafter, the positioned upper half shell 16 and the lower half shell 16 are secured together to thereby retain the positioned end piece 12 and the electrical package 14 therebetween (step 705). In the case of the aforementioned latches and catches at the lateral sides of the half shells, such securing may take place by the appropriate application of pressure to engage the latches to the corresponding catches. Such pressure must be judiciously applied in order to avoid damage to the half shells, the end piece and/or the electrical package 14 sandwiched between the half shells 16.

Notably, while one construction method for the enclosure 10 and end piece 12 has been disclosed herein, other construction methods may also be employed without departing from the spirit and scope of the present invention. As but one example, rather than positioning the end piece 12 with respect to the half shells 16 and then securing the half shells 16 together, the half shells 16 may first be secured together and then the end piece 12 may be inserted into the enclosure 10 through the open end thereof. As may be realized, this requires that the arms 28 of the end piece 12 have a degree of flexibility to move inward and accommodate the fingers 30 within the enclosure prior to the fingers 30 engaging the corresponding notches. Likewise, a contacting bevel (not shown) may be supplied in an appropriate location on each finger 30 to accommodate sliding contact of the finger 30 with the enclosure 10. Of course, the electrical package 14 within the enclosure 10 must leave enough space to accommodate the inwardly moving arms 28 of the end piece 12.

In the foregoing description, it can be seen that the present invention comprises a new and useful enclosure 10 for an electrical package 14, and an end piece 12 for the enclosure 10. It should be appreciated that changes could be made to the embodiments described above without departing from the inventive concepts thereof. It should be understood, therefore, that this invention is not limited to the particular embodiments disclosed, but it is intended to cover modifications within the spirit and scope of the present invention as defined by the appended claims.

What is claimed is:

1. An enclosure for an electrical package, the enclosure comprising:

a pair of half shells combined to define an interior cavity within which the electrical package resides, the interior cavity as defined by the half shells being open at one end thereof opposite an end at which resides a connector of the package;

an end piece mounted to the half shells as combined to cover the open end of the interior cavity and close the electrical package within the enclosure at such open ends the end piece including a cover section generally positioned at the open end and a pair of arms extending from the cover section and into the interior cavity;

the enclosure having a pair of opposing lateral sides, each of the pair of arms extending generally along a respective lateral side of the enclosure;

the half shells in combination defining a notch at each lateral side of the enclosure and each of the pair of arms including a finger extending into a respective notch to secure the end piece to the half shells as combined.

2. The enclosure of claim 1 wherein the end piece is formed as a substantially unitary body.

3. The enclosure of claim 1 wherein each half shell has a generally planar exterior panel with an edge at the open end and a flange extending from the edge and into the open end, each flange extending generally toward the other flange, and wherein the end piece includes a cover section generally positioned at the open end, the cover section having a perimeter including opposing sides generally corresponding to the exterior panels of the half shells, each opposing side including a groove, each groove accepting a flange from a respective one of the half shells, the grooves and flanges at least partially securing the end piece to the half shells as combined.

4. The enclosure of claim 1 wherein the cover section has a perimeter and the half shells as combined define an exterior surface of the enclosure, and wherein the perimeter of the cover section is generally co-extensive with the exterior surface of the enclosure.

5. The enclosure of claim 1 wherein each of the pair of arms is shaped to conform to each half shell as defining the interior cavity, thereby at least partially providing structural integrity to the enclosure.

6. The enclosure of claim 1 wherein each half shell includes an interlocking structure at each lateral side thereof, each interlocking structure being constructed to securely mate with the respective interlocking structure of the other half shell.

7. The enclosure of claim 1 wherein each notch is adjacent to the interior cavity and opens into the interior cavity.

8. The enclosure of claim 7 wherein each finger extends away from the other finger and into the respective notch.

9. The enclosure of claim 1 wherein the half shells as combined define an exterior, and wherein the end piece defines at least one aperture therein for allowing access to the interior cavity and the electrical package from the exterior.

10. The enclosure of claim 9 wherein the at least one aperture is sized to accept a first connector inserted therethrough to couple with a second connector mounted to the electrical package.

11. The enclosure of claim 1 constructed according to a PCMCIA standard.

12. The enclosure of claim 11 constructed according to a PCMCIA Type II card standard.

13. An end piece for use in combination with an enclosure for an electrical package, the enclosure comprising a pair of half shells combined to define an interior cavity within which the electrical package resides, the interior cavity as defined by the half shells being open at one end thereof opposite an end at which resides a connector of the package, the end piece for being mounted to the half shells as combined to cover the open end of the interior cavity and close the electrical package within the enclosure at such open end, the end piece comprising a cover section for being generally positioned at the open end, and a pair of arms extending from the cover section, the pair of arms for extending into the interior cavity, the enclosure having a pair of opposing lateral sides, each of the pair of arms being positioned on the cover section to extend generally along a respective lateral side of the enclosure, the half shells in combination defining a notch at each lateral side of the enclosure, each of the pair of arms including a finger for extending into a respective notch to secure the end piece to the half shells as combined.

14. The end piece of claim 13 formed as a substantially unitary body.

15. The end piece of claim 13 wherein each half shell has a generally planar exterior panel with an edge at the open end and a flange extending from the edge and into the open end, each flange extending generally toward the other flange, and wherein the end piece includes a cover section generally positioned at the open end, the cover section having a perimeter including opposing sides generally corresponding to the exterior panels of the half shells, each opposing side including a groove, each groove for accepting a flange from a respective one of the half shells, the grooves and flanges at least partially securing the end piece to the half shells as combined.

16. The end piece of claim 13 wherein the cover section has a perimeter and the half shells as combined define an exterior surface of the enclosure, and wherein the perimeter of the cover section is generally co-extensive with the exterior surface of the enclosure when the end piece is mounted to the enclosure.

17. The end piece of claim 13 wherein each of the pair of arms is shaped to conform to each half shell as defining the interior cavity, thereby at least partially providing structural integrity to the enclosure.

18. The end piece of claim 13 wherein each notch is adjacent to the interior cavity and opens into the interior cavity, and wherein each finger extends away from the other finger.

19. The end piece of claim 13 wherein the half shells as combined define an exterior, and wherein the end piece defines at least one aperture therein for allowing access to the interior cavity and the electrical package from the exterior.

20. The end piece of claim 19 wherein the at least one aperture is sized to accept a first connector inserted therethrough to couple with a second connector mounted to the electrical package.

21. The end piece of claim 13 constructed according to a PCMCIA standard.

22. The end piece of claim 21 constructed according to a PCMCIA Type II card standard.

23. A method for constructing an enclosure for an electrical package, the method comprising:
  combining a pair of half shells to define an interior cavity within which the electrical package resides, the interior cavity as defined by the half shells being open at one end thereof opposite an end at which resides a connector of the package;
  mounting an end piece to the half shells to cover the open end of the interior cavity and close the electrical package within the enclosure at such open end,
  the end piece including a cover section and a pair of arms extending from the cover section, the enclosure having a pair of opposing lateral sides, the half shells each defining a half-notch at each lateral side thereof and each of the pair of arms including a finger, the method comprising:
    positioning the end piece between the half shells such that the cover section is generally positioned at the open end and the pair of arms extends into the interior cavity when the half shells are combined such that each of the pair of arms extends generally along a respective lateral side of the enclosure, such positioning further comprising:
      positioning the end piece with respect to the one half shell such that each finger of the end piece is accepted by a respective half-notch of the one half-shell; and
      positioning the other half shell with respect to the one half shell and the positioned end piece such that each finger of the end piece is accepted by a respective half-notch of the other half shell; and
    securing the positioned other half shell and the one half shell together such that the half-notches and fingers at least partially retain the positioned end piece.

24. The method of claim 23 comprising:
  positioning the end piece with respect to one half shell;
  positioning the other half shell with respect to the one half shell and the positioned end piece; and
  securing the positioned other half shell and the one half shell together to thereby retain the positioned end piece therebetween.

25. The method of claim 24 wherein each of the half shells has a generally planar exterior panel with an edge at the open end and a flange extending from the edge and into the open end, each flange extending generally toward the other flange, and wherein the end piece includes a cover section generally positioned at the open end, the cover section having a perimeter including opposing sides generally corresponding to the exterior panels of the half shells, each opposing side including a groove, the method comprising:
  positioning the end piece with respect to one half shell such that the flange of the one half shell is accepted by the respective groove of the end piece;
  positioning the other half shell with respect to the one half shell and the positioned end piece such that the flange of the other half shell is accepted by the respective groove of the end piece; and
  securing the positioned other half shell and the one half shell together such that the grooves and flanges at least partially retain the positioned end piece therebetween.

26. The method of claim 23 comprising mounting an end piece formed as a substantially unitary body.

27. The method of claim 23 each of the half shells has a generally planar exterior panel with an edge at the open end and a flange extending from the edge and into the open end, each flange extending generally toward the other flange, and wherein the end piece includes a cover section generally positioned at the open end, the cover section having a perimeter including opposing sides generally corresponding to the exterior panels of the half shells, each opposing side including a groove, the method comprising mounting the end piece such that each groove accepts a flange from a respective one of the half shells, the grooves and flanges at least partially securing the end piece to the half shells as combined.

28. The method of claim 23 comprising mounting an end piece including a cover section and a pair of arms extending from the cover section such that the cover position is generally positioned at the open end and the pair of arms extends into the interior cavity.

29. The method of claim 28 wherein the cover section has a perimeter and the half shells as combined define an exterior surface of the enclosure, the method comprising mounting the end piece such that the perimeter of the cover section is generally co-extensive with the exterior surface of the enclosure.

30. The method of claim 28 wherein the enclosure has a pair of opposing lateral sides, the method comprising mounting the end piece such that each of the pair of arms extends generally along a respective lateral side of the enclosure.

31. The method of claim 30 comprising mounting an end piece having a pair of arms where each of the pair of arms is shaped to conform to each half shell as defining the interior cavity, thereby at least partially providing structural integrity to the enclosure.

32. The method of claim 30 wherein the half shells in combination define a notch at each lateral side of the enclosure and wherein each of the pair of arms includes a finger, the method comprising mounting the end piece such that each finger extends into a respective notch to secure the end piece to the half shells as combined.

* * * * *

UNITED STATES PATENT AND TRADEMARK OFFICE
CERTIFICATE OF CORRECTION

PATENT NO.    : 6,365,832 B1
DATED         : April 2, 2002
INVENTOR(S)   : James S. Staron et al.

It is certified that error appears in the above-identified patent and that said Letters Patent is hereby corrected as shown below:

Column 1,
Line 61, please delete "I" and insert -- /. --

Column 3,
Line 10, please insert the word -- of -- after the word "enclosure."
Line 16, please insert the word -- in -- after the number "2."

Column 6,
Line 60, please delete the word "if."

Column 8,
Line 9, please delete the word "ends" and insert the word -- end. --

Column 10,
Line 53, please insert the word -- wherein -- after the number "23."

Signed and Sealed this

Sixth Day of August, 2002

Attest:

JAMES E. ROGAN
Attesting Officer        Director of the United States Patent and Trademark Office